United States Patent [19]

Hall et al.

[11] Patent Number: 5,566,344

[45] Date of Patent: Oct. 15, 1996

[54] IN-SYSTEM PROGRAMMING ARCHITECTURE FOR A MULTIPLE CHIP PROCESSOR

[75] Inventors: Christopher M. Hall, Redwood City; Gary D. Phillips, San Jose; William E. Miller, Los Gatos; David W. Weinrich, San Jose; Richard E. Crippen, Mountain View; Robert M. Salter, III, Saratoga, all of Calif.

[73] Assignee: National Semiconductor Corporation, Santa Clara, Calif.

[21] Appl. No.: 445,006

[22] Filed: May 19, 1995

Related U.S. Application Data

[62] Division of Ser. No. 359,417, Dec. 20, 1994.

[51] Int. Cl.$^6$ .................................................. G06F 15/76
[52] U.S. Cl. .................. 395/800; 364/232.8; 364/232.7; 364/232.3; 364/238.4; 364/DIG. 1
[58] Field of Search ............................. 395/800, DIG. 1, 395/275, 325, 871, 834, 823, 700, 650, 500, 438, 827; 364/948.1, 870, 600, 280.9, 244.6

[56] References Cited

U.S. PATENT DOCUMENTS

| | | | |
|---|---|---|---|
| 4,720,812 | 1/1988 | Kao et al. | 395/800 |
| 5,113,500 | 5/1992 | Talbolt et al. | 395/309 |
| 5,307,464 | 4/1994 | Akao et al. | 395/325 |
| 5,321,895 | 6/1994 | Sawase et al. | 395/800 |
| 5,499,585 | 3/1996 | Farmwald et al. | 395/823 |
| 5,504,903 | 4/1996 | Chen et al. | 395/700 |

OTHER PUBLICATIONS

Mano, Morris, "Computer Engineering: Hardware Design" pp. 286–292, 1991.

*Primary Examiner*—Alpesh M. Shah
*Attorney, Agent, or Firm*—Limbach & Limbach LLP

[57] ABSTRACT

An architecture for a serial multi-chip package digital controller including a controller oriented processor die and a separate non-volatile memory die. The architecture provides for a low pin count on the package, minimal electrical connections on and between the dice, and a minimal number of registers by making use of significant multiplexing to allow many of the registers and signal lines to serve multiple functions responsive to the mode of operation and other control signals.

The processor can be programmed internally or externally. In the in-system programming mode, the processor program counter is used to fetch running instructions out of an on-board ROM instruction memory on the processor die. The processor core outputs an address into which data is to be programmed on its output data bus. The processor core then receives from an external device the data which is to be programmed into the selected address and outputs it serially onto the data bus and therefrom to the memory die. The address and program data are then parallel output from separate registers on the memory die along with a program pulse to program the memory core.

10 Claims, 8 Drawing Sheets

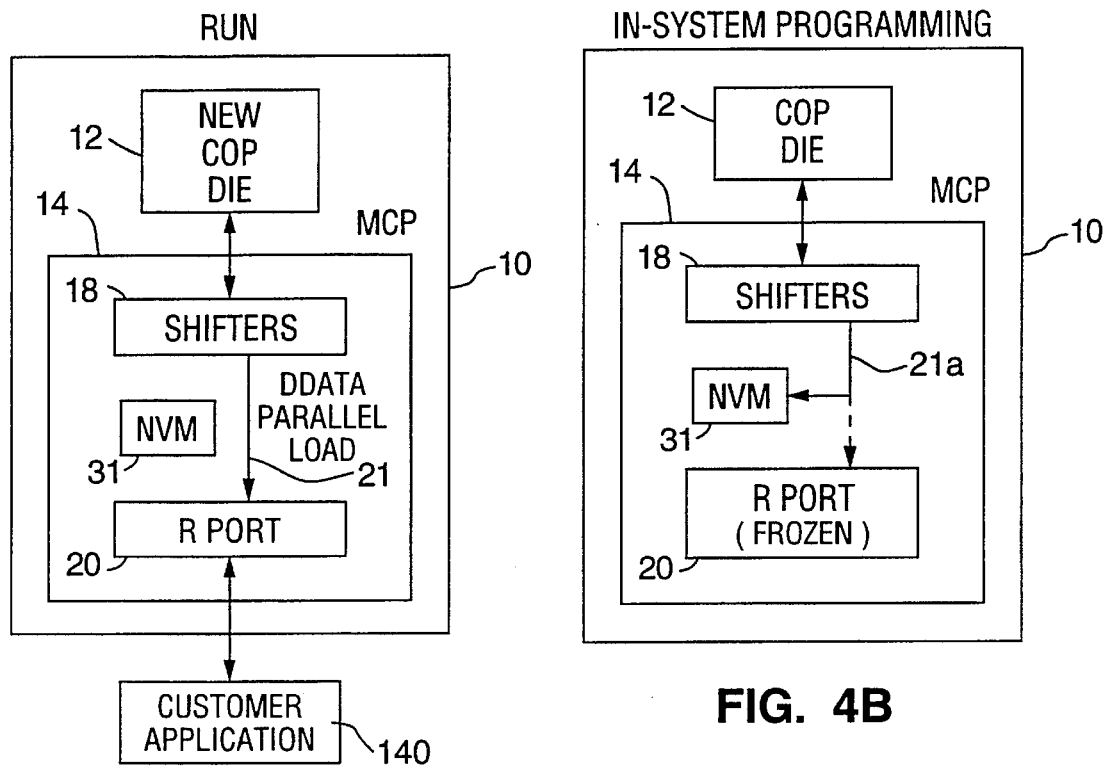
FIG. 4A
FIG. 4B
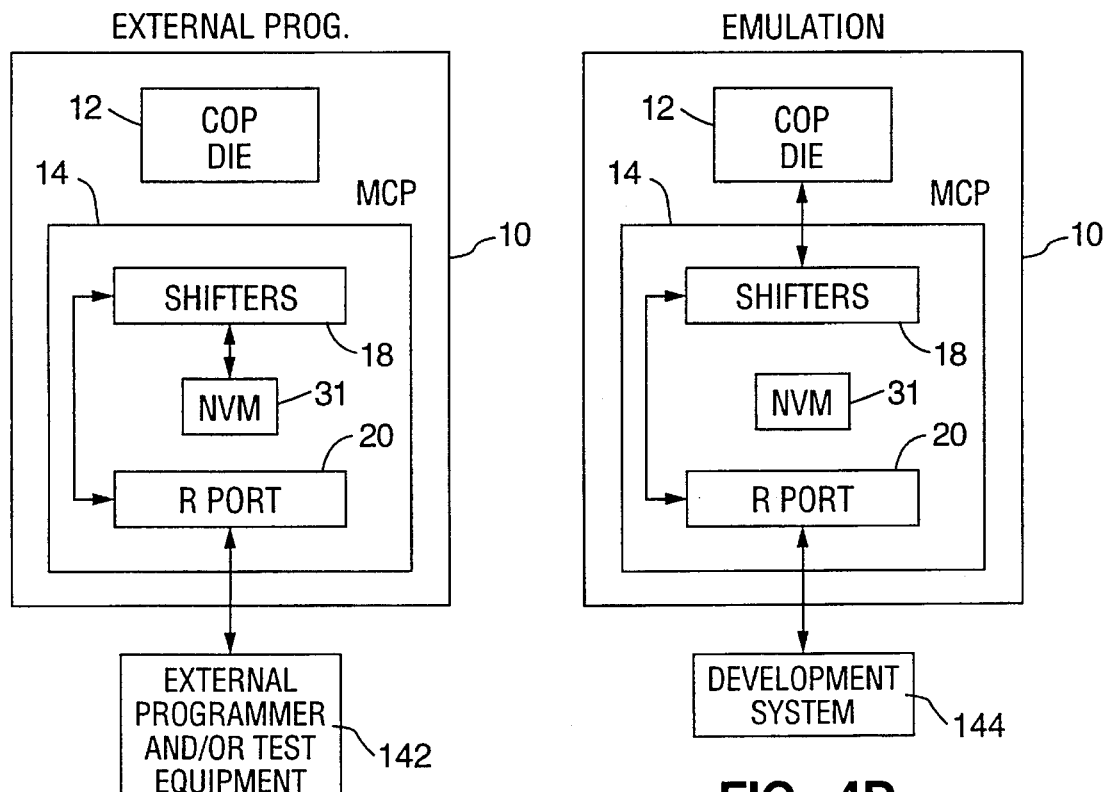
FIG. 4C
FIG. 4D

3

IN-SYSTEM PROGRAMMING ARCHITECTURE FOR A MULTIPLE CHIP PROCESSOR

This is a divisional of application Ser. No. 08/359,417, filed Dec. 20, 1994.

FIELD OF THE INVENTION

The invention pertains to digital processors. More particularly, the invention pertains to a digital processor comprised of separate processor and non-volatile memory dice contained in a multiple chip package.

BACKGROUND OF THE INVENTION

Microcontroller devices typically include an on-chip non-volatile memory element which stores application software (i.e., instructions) for running the chip. More rare, but also known are multi-chip packages or MCPs in which the non-volatile memory (or NVM) is embodied on a separate die from the actual processor hardware. The two separate dice are packaged in a single MCP.

Typically, these MCPs or single chip processors (SCPs) have a parallel communication architecture both internally and externally of the chip. Processors with a serial communication architecture, internal and/or external are more rare, but are known. Parallel architecture chips or MCPs can certainly be advantageous in many instances, but typically lead to greater expense and more difficult fabrication due to the need for increased numbers of electrical connections (e.g., wires, electrical traces, pads and pins).

It is common for the non-volatile memory element in these SCPs or MCPs to be of the ROM variety in which the application program is fabricated into the device during manufacturing and can never be altered. However, it is increasingly more common for the non-volatile memory element to be either one time programmable, such as an EPROM, or programmable, erasable and reprogrammable, such as an EEPROM or FLASH memory.

Typically, to place an application program in a programmable NVM, the chip must be placed in a programming apparatus which can be configured to cause the desired program to be stored in the NVM permanently (or at least until reprogrammed). Thus, in the case of a reprogrammable NVM such as an EEPROM or a FLASH memory, if the user wishes to change the application program at a time after the chip or MCP has been in use, the user must remove the chip from the application environment in which it is embodied to place it in a programming apparatus for reprogramming. This can be difficult and sometimes impossible.

Accordingly, it is an object of the present invention to provide an improved MCP processor.

It is another object of the present invention to provide a low-cost, easy to fabricate serial architecture MCP processor.

It is a further object of the present invention to provide an MCP digital processor having in-system programming capabilities.

It is yet a further object of the present invention to provide an MCP processor with a bus multiplexing architecture which can accommodate multiple programming modes and an emulation mode without a substantial increase in registers and connections on the dice.

SUMMARY OF THE INVENTION

The invention pertains to a multi-chip package digital processor in which a controller oriented processor die and a separate non-volatile memory die are contained in a single package to provide a low-cost, highly flexible digital controller. Further, the internal data and address communication channels between the two dice are serial in order to reduce pin count and wiring requirements and, consequently, cost and complexity.

The controller oriented processor (processor) die includes a D port on an edge of the die which has a plurality of pads electrically coupled to mating pads on an edge of the non-volatile memory (NVM) die which faces the processor die D port. The interface pads on the NVM die are coupled to an interface circuit on the NVM die, which includes shift registers for temporarily storing data transferred between the two dice and multiplexers for selectively setting communication pathways on the NVM die depending on the operational mode of the MCP. On the opposite edge of the non-volatile memory die is a recreated (or R) port, which port emulates the D port of the processor die in normal run mode.

There also are multiplexers on the processor die which selectively set communication pathways.

Depending on operational mode and other factors, a particular signal from the processor die may be connected directly from the interface to the R port on the NVM die (flow through) or may be directed from the interface to the NVM core (e.g., the actual memory circuitry on the NVM die).

The R port is coupled to package pads for communication with components external to the multi-chip package. In normal run mode, the R port acts as a communication link between the processor die and external componentry. However, during other modes of operation, the interface circuit multiplexers and processor die multiplexers are controlled to reroute internal connections on the NVM and processor dice so that the R port is used for other purposes. For instance, in external programming mode, the R port is used for communication between an external programmer and the NVM core (while the processor die is essentially isolated from the NVM die).

In a preferred embodiment, the multi-chip package has four operational modes, including (1) run mode, (2) in-system programming mode, (3) external programming mode, and (4) emulation (or development) mode. In run mode, the R port on the NVM die is coupled through the interface to receive data intended for external devices from the D port on the processor die so that the processor die can exchange data with external devices. The interface also provides signal paths between the D port of the processor die and the NVM core for instruction fetching.

In external programming mode, the R port is coupled through the interface to componentry in the NVM core. The processor die is not in use.

In the in-system programming mode, the D port is in communication with the NVM core through the interface circuit and the R port is frozen, i.e., the R port latch outputs are held at their current values.

In emulation mode, an external device for running the emulation is coupled to the R port on the NVM die and communicates with the processor die via the R port and interface circuit on the NVM die and the D port on the processor die. The NVM core is essentially bypassed in emulation mode so that the processor die can communicate directly with the external emulation apparatus.

In order to provide the various data flow paths for the various modes of operation, a plurality of multiplexers and registers are provided on both dice for controlling the flow of data between the two die or between a die and an external device.

The interface on the NVM die includes a plurality of multiplexers and a plurality of shift registers for temporarily holding data exchanged between the processor die and the NVM die. In run mode, for instance, there are serial to parallel PROGRAM COUNTER shift registers for accepting from the processor die an address into the NVM core from which instructions are to be retrieved. There also is a serial to parallel INPUT DATA shift register for accepting serial data from the processor die, which data is to be transferred to the R port and on to external devices. The interface also includes a parallel to serial RETURN DATA register for receiving instructions from the NVM core to be returned to the processor core for execution. Finally, there is a serial to parallel MEMORY INTERFACE CONTROL register which contains control bits primarily for controlling the aforementioned interface multiplexers. This register accepts serial data from a corresponding memory interface control register on the processor die and outputs the various bits in parallel form to the timing and control circuitry on the NVM die. The timing and control circuitry uses the memory interface control register bits to set the various multiplexers, among other uses.

In other modes, however, these shift registers are re-used for other purposes, thus conserving the number of registers needed in the MCP. For instance, in external programming mode, the PROGRAM COUNTER shift registers are still used for addressing the NVM core. However, instead of accepting the address from the processor, multiplexers are set to cause addresses to be input to those registers from an external programmer coupled to the R port. The flow of data out of the OUTPUT DATA register also is altered for external programming mode. Particularly, during external programming verification operations, the serial output of the OUTPUT DATA register is connected to the R port, rather than shifted back to the processor die. The data is then sent out of the R port to the external programmer so it can verify that the correct data has been programmed into the NVM.

In addition, a multiplexer having an output connected to the input of the INPUT DATA register is switched to accept data from the R port rather than from the processor die. Further, the output of the INPUT DATA register, in addition to being coupled to latches in the R port for use during run mode is also coupled to a parallel PROGRAM DATA register which, in turn, is coupled to the data input terminals of the NVM core memory so that, in this mode, it can be used for holding data to be programmed into the specified address of the NVM core memory. The output of the INPUT DATA register is also coupled to a parallel NVM CONTROL register. The parallel outputs of the NVM CONTROL register are coupled so that the bits individually set various NVM memory conditions needed for performing specific memory integrity tests which are to be performed following fabrication.

In the in-system programming mode, the processor program counter is used to fetch running instructions out of an on-board ROM instruction memory on the processor die. (The processor cannot fetch instructions out of a memory which it is programming). The processor core outputs an NVM core address into which data is to be programmed on its output data bus. That address is shifted through the D port into serial-to-parallel program counter registers on the NVM die. The processor core then receives from an external device the data which is to be programmed into the selected address and outputs it serially onto the data bus, through the D port, into the serial-to-parallel input data register on the NVM die. The address and program data are then parallel output from the NVM program counter and input data registers, respectively along with a program pulse to program the NVM core.

Next, to verify that the data was properly stored, the address currently contained in the address registers on the NVM die is sent in parallel to the NVM core again and the data at that location is read out in parallel into the DATA OUT register on the NVM die. It is then serially shifted out of the data out register on the NVM die to the D port which forwards it to the processor core via the processor data bus for verification.

BRIEF DESCRIPTION OF THE DRAWINGS

FIGS. 4A–4D diagrammatically illustrate the general flow of data, addresses, and control signals between the processor die, NVM die and external componentry in different operational modes of the multi-chip package in accordance with the first embodiment of the invention.

DETAILED DESCRIPTION A PREFERRED EMBODIMENT OF THE INVENTION

Figure 1:
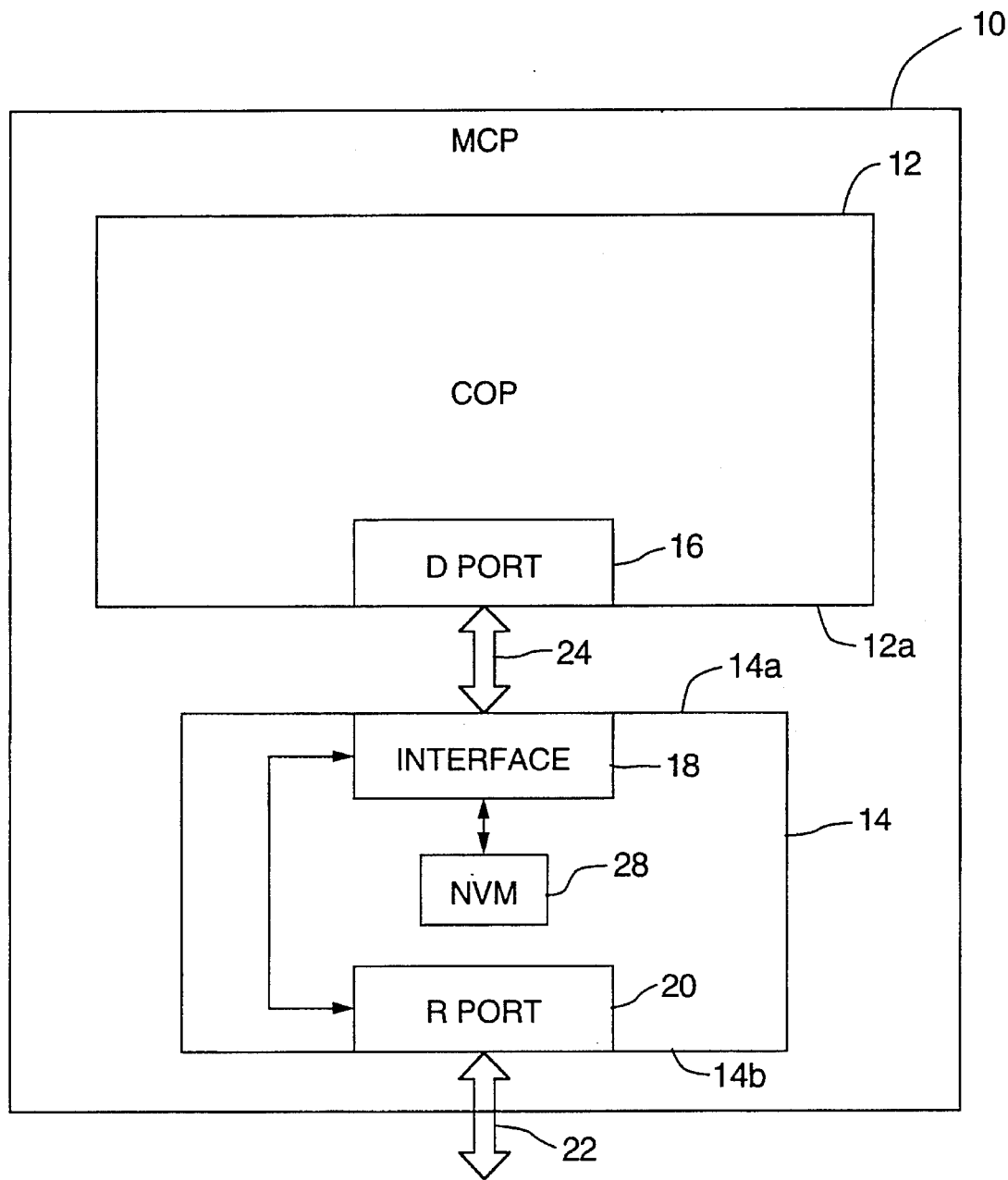
FIG. 1 is a top level diagram illustrating a multi-chip package processor in accordance with the present invention.

Overview of Apparatus:

FIG. 1 is a top level block diagram of a multi-chip package digital controller 10 in accordance with the present invention. As shown, the multi-chip package (or MCP) digital controller 10 comprises two separate dice, namely, a controller oriented processor (or processor) die 12 and a separate non-volatile memory (or NVM) die 14. Data flow and addressing internal to the MCP 10 is carried out in a serial architecture. The separation of the NVM die 14 from the processor die 12 substantially increases flexibility in the manufacture of digital controllers. Particularly, changes can be made to the processor componentry without affecting NVM componentry and vice versa. In a single chip processor (or SCP), any change in design specification could require ancillary changes throughout the die, such as moving of componentry and/or traces. In the multi-chip digital controller of the present invention, however, changes to the processor core will not require ancillary changes to the NVM core and vice versa.

The NVM memory may be a ROM; however, in a preferred embodiment of the invention the NVM is an electronically programmable memory, such as an EPROM, or even more preferably, a reprogrammable memory such as an EEPROM or FLASH memory. If the NVM is electronically programmable, then the processor die still includes a small ROM section which is used for in-system programming of the NVM, as will be described in greater detail herein. This feature is highly advantageous in that the NVM can be programmed or reprogrammed by the user without the need for an external programmer or even removal of the MCP from its application environment.

The serial architecture of the present invention is advantageous in that the pin count of the MCP is kept low and the electrical traces on the dice are also kept to a smaller number than in a parallel architecture digital controller.

In normal run mode, the processor on the processor die will commonly need to communicate with external devices. As illustrated in FIG. 1, this communication with external devices is carried out through a D port 16 on the processor die which communicates with external devices through interface circuitry 18 on the NVM die 14 and a recreated (or R) port 20 on the NVM die. The R port includes a plurality of parallel latches 36 (see FIG. 2). The R port 20 on the NVM die 14 is actually wire connected to package pins (represented by arrow 22 in FIG. 1) to provide a communication link to the external devices. The recreated port 20 is so-named essentially because its purpose is to emulate the D port 16 on the processor die 12 in run mode.

Overview of Operational Modes:

In normal run mode, the D port exchanges signals with the interface 18 on the NVM die 14 (as illustrated by arrow 24) some of which signals are intended for or received from external componentry through the R port (such as control signals for external circuitry) and some of which are intended for or received from the NVM memory core (such as instruction fetch addresses and returned instructions). The interface 18 routes those signals which are intended for or received from the R port around the componentry on the NVM so as to provide communication between the processor and the external componentry without use of any NVM componentry other than the interface 18 and R port 20. Those signals which are intended for the NVM die itself, such as an address into the NVM core are routed to the NVM core and those signals which are to be returned from the NVM to the processor, such as instructions out of the NVM are routed by interface 18 to D port 16. In certain modes, signals received at the R port can be intended for the NVM core. Interface 18 also includes circuitry for routing these signals from the R port 20 to the NVM core 28 through interface 18.

As will be described in greater detail below, the MCP digital controller of the present invention has four distinct operation modes, namely, (1) run mode, (2) external programming mode, (3) in-system programming mode, and (4) emulation mode. Run mode is the normal operating mode in which the processor fetches instructions out of the NVM and executes them and exchanges data with external devices through the R port. In external programming mode, however, the R port pins are reused to communicate with the external programmer. In external programming mode, interface 18 is reconfigured to alter signal flow such that the R port is coupled to the NVM core through the interface 18 and the processor die 12 is essentially removed from communication with the NVM die 14.

In the in-system programming (or ISP) mode, the R port is frozen so that the processor core can communicate with the NVM core without affecting any external devices through the R port 20. Interface 18 also reroutes the data sent from the processor die to place it on the data input leads of the NVM core (so it can be programmed into the memory) rather than to the R port.

In emulation mode, interface 18 is reconfigured to essentially cut out the NVM core from communication with the processor core. Thus, the interface 18 is reconfigured to send all data fetch addresses directly from the interface 18 to the R port 20 and to an external emulation apparatus which essentially replaces the NVM core. Interface 18 also is set to pass instructions from the emulation device rather than the NVM core when in emulation mode.

Detailed Disclosure of the Structure

The NVM Die

Figure 2:
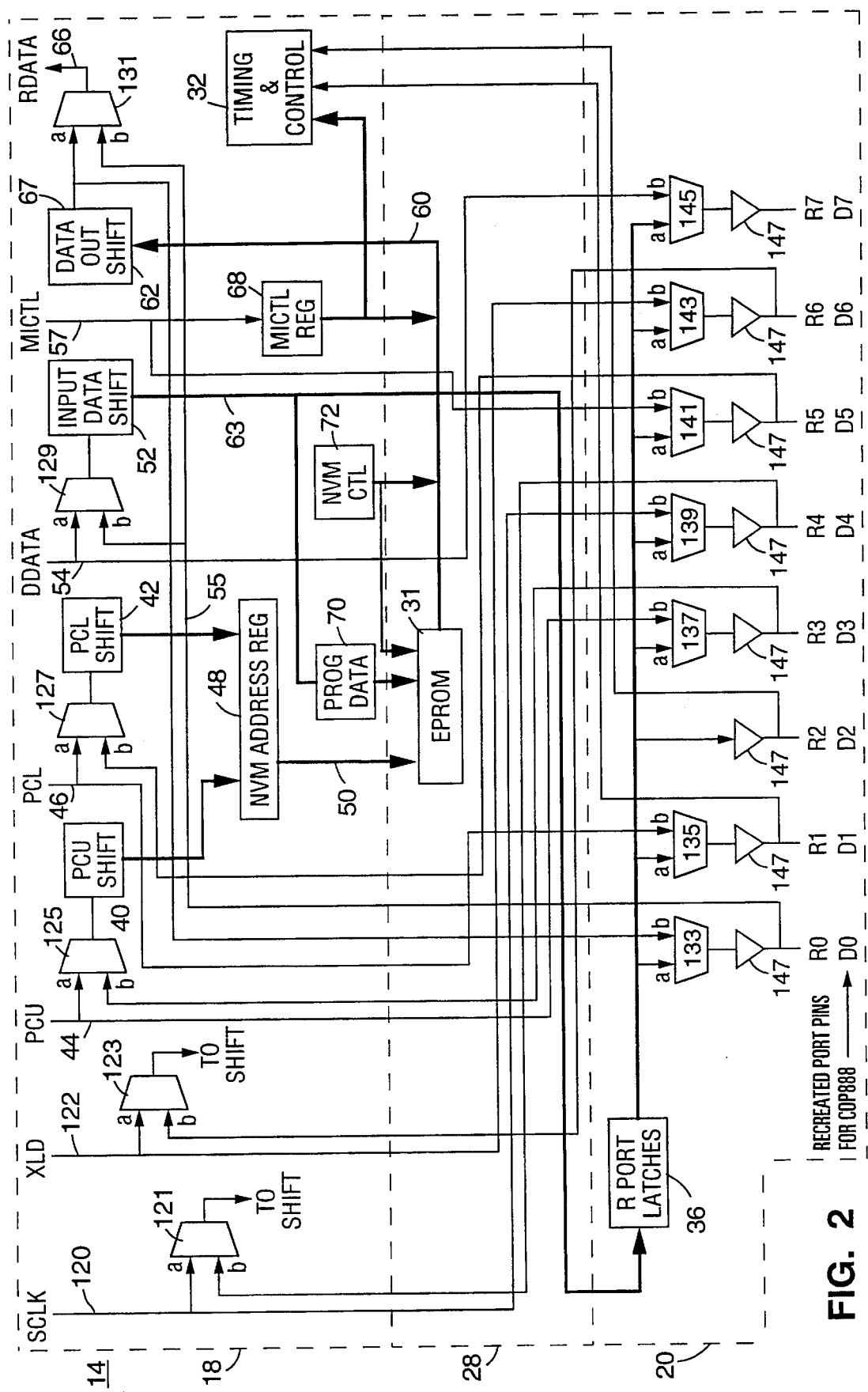
FIG. 2 is a more detailed block diagram of a first embodiment of the non-volatile memory die in the multi-chip package of FIG. 1.

FIG. 2 is a more detailed block diagram of the NVM die 14 in FIG. 1 in accordance with the first embodiment of the invention. For sake of clarity, the NVM die can be considered to comprise three main component groups. They are (1) interface 18, comprising the circuitry above the dashed line 19 in FIG. 2, (2) the NVM core 28, which is shown between line 19 and the dot-dash line 21 in FIG. 2, and (3) the R port 20, which is shown below line 21 in FIG. 2.

The NVM core 28 comprises the actual memory core, which in FIG. 2 is shown as a one time programmable (OTP) EPROM 31, but can be any other type of non-volatile memory such as a ROM, EEPROM, or FLASH memory.

The R port section 30 includes die pads (not shown) which are connected by wires to package pads for external communication. A plurality of latches 36 are used for latching incoming and/or outgoing data in certain modes, but are not used in other modes. Accordingly, a plurality of multiplexers 133, 135, 137, 139, 141, 143, and 145 for coupling data either from the latches or elsewhere on the NVM die (depending on the operational mode) are provided.

The interface portion 18 of the NVM die 14 comprises a plurality of registers for temporarily storing data and/or converting it between parallel and serial formats and a plurality of multiplexers for variably selecting the source or destination of the register inputs or outputs, respectively, depending on the operational mode which is dictated by mode bits, as described more fully further below.

The registers may serve different functions (i.e., store different kinds of data received from and/or intended for different sources and/or destinations) depending on the mode of operation. In the figures, however, most registers are named to correspond to their purpose during run mode operation of the MCP. Accordingly, the structure and purpose of the various components will be described primarily with respect to run mode.

The PROGRAM COUNTER UPPER (PCU) and PROGRAM COUNTER LOWER (PCL) shift registers 40 and 42 are coupled to receive 8 serial bits of data either from serial input lines 44 and 46 through the (a) inputs of multiplexers 125 and 127, respectively, from the processor die in run mode or from two R port pads through the (b) inputs of multiplexers 125 and 127 in external programming mode. They are serial shift/parallel out registers. In the particular embodiment described here, the EPROM memory core 31 comprises 32 kilobytes of memory and thus can be addressed by 15 address bits. Accordingly, the PCU shift register is coupled to receive the seven most significant address bits and a PCU15 bit (to be described later) output from the program counter of the processor on 1 bit serial line 44. The PCL shift register 42 is coupled to serially shift in the 8 least significant bits of the program counter output from the processor on 1 bit serial line 46. The PCU and PCL shift register outputs are coupled to 16 bit parallel NVM ADDRESS register 48. The 15 LSBs of the NVM ADDRESS register's parallel output are coupled to the address inputs of EPROM 31 to access a memory location therein. The 16th bit, i.e., the PCU15 bit, is sent elsewhere, as will be discussed in greater detail herein.

The 8 bit parallel instruction output of the EPROM 31 is coupled on lines 60 to DATA OUT register 62. DATA OUT register 62 is a parallel in/serial shift out register. The DATA OUT register 62 has its serial shift output coupled both to line 66 which returns to the processor die and to line 67 which is coupled to the R port for external programming mode.

Interface 18 also includes an 8-bit serial shift in/parallel out INPUT DATA register 52. It is coupled to receive input data from the processor die through 1-bit serial line 54 and the (a) input of multiplexer 129 or from the R port on line 55 through the (b) input of multiplexer 129. The parallel output 63 of register 52 is coupled to three locations, namely, a PROGRAM DATA register 70, an NVM CONTROL register 72, and R port 20. Accordingly, depending on mode of operation, INPUT DATA register 52 may receive from the processor die (1) program data to be programmed into the NVM memory core 31 through PROGRAM DATA register 70, (2) NVM control data for NVM CONTROL register 72 which is used during memory testing, or (3) data intended for external devices through R port 20 (as in normal run mode).

In addition to the aforementioned registers, a MEMORY INTERFACE CONTROL (MICTL) shift register 68 is a serial shift in/parallel out register coupled to receive memory interface control signals from the processor die on line 57. The output bits of the MICTL shift register are coupled to the timing and control circuitry 32 for setting certain control conditions on the NVM die. These conditions include the setting of various multiplexers, as will be discussed in greater detail hereinafter.

The NVM die also includes signal paths to receive two additional signals from the processor die, namely, the serial clock signal, SCLK on line 120 through the (a) input of multiplexer 121, and the parallel load signal, XLD, on line 122 through the (a) input of multiplexer 123. The SCLK signal controls the timing for shifting bits into and out of the various shift registers in interface 18. The XLD signal is used to pulse the registers to cause the shift registers having corresponding parallel registers to load the corresponding parallel registers with data. The (b) inputs of multiplexers 121 and 123 allow SCLK and XLD signals to be selectively provided from external devices through the R port, rather than from processor die. This path would be used for instance during external programming mode.

Connections 44, 46, 54, 57, 120 and 122 from the processor die are also coupled to the (b) inputs of R port multiplexers 137, 135, 145, 141, 139, and 143, respectively, for purposes relevant to the emulation mode, as will be discussed in better detail herein.

The Controller Oriented Processor Die

Figure 3:
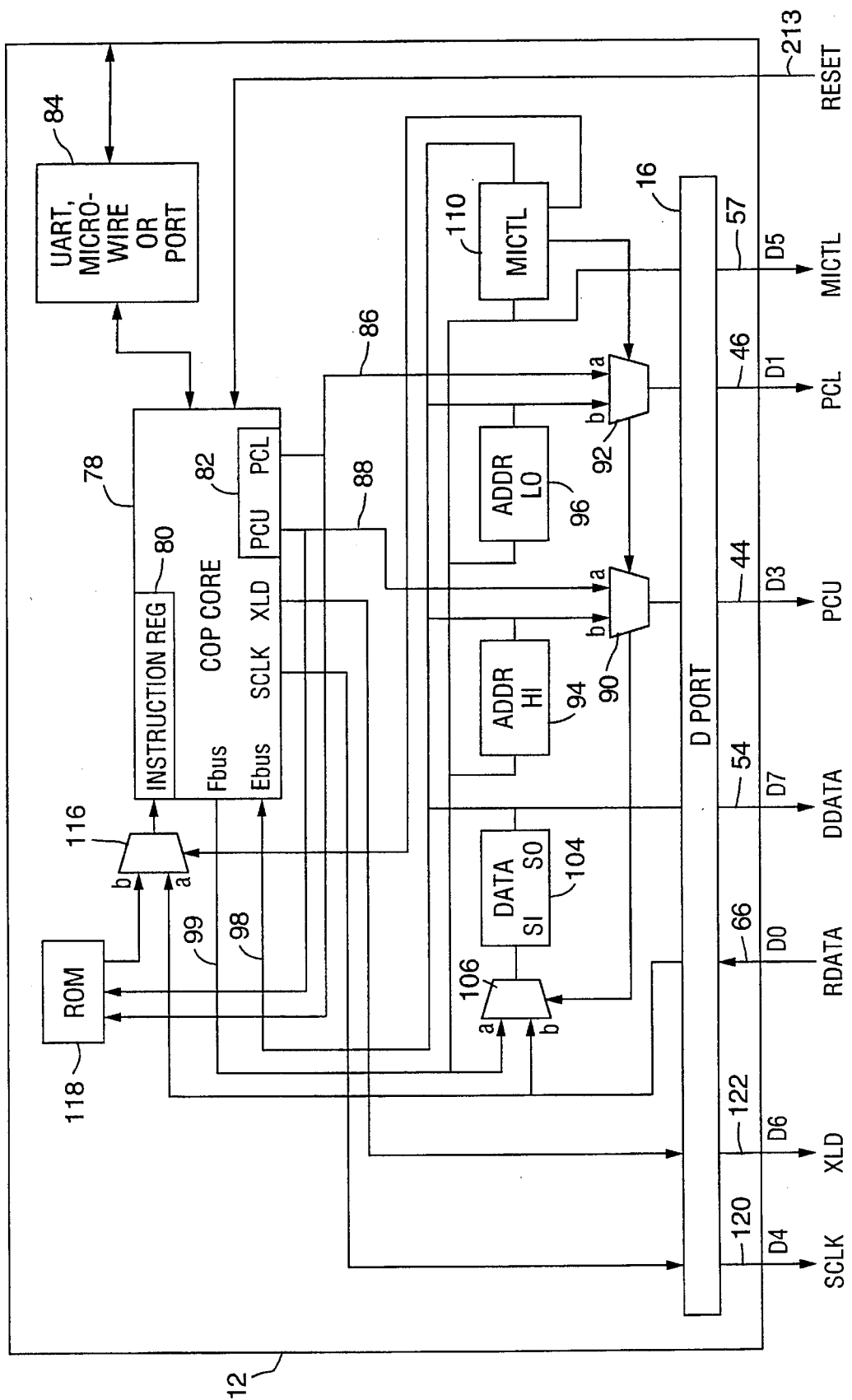
FIG. 3 is a more detailed block diagram of the controller oriented processor die in the multi-chip package of FIG. 1 in accordance with the first embodiment of the invention.

FIG. 3 is a detailed block diagram of the processor die of FIG. 1. The processor die circuitry includes a processor core 78. The processor core 78 includes an instruction register 80 and a program counter 82. A communication channel 84, which may be a universal asynchronous receiver-transmitter (UART), a micro-wire or a port, for instance, provides a communication path between the processor core 78 and external devices. Channel 84 is used, for instance, in the in-system programming mode for receiving data which is to be programmed into the EPROM 31. Channel 84 is used in run mode for serial and/or parallel signals. The processor die also includes a one bit serial data-in bus 98 and a one bit serial data-out bus 99.

In the illustrated embodiment, the NVM core memory is a 32 k byte EPROM requiring 15-bit addresses. The program counter 82 is coupled to output the addresses into the NVM core memory on two serial lines 86 and 88. In particular, the 8 LSBs of the address, hereinafter referred to as program counter lower (or PCL) bits, are coupled through serial line 86 to the (a) input of multiplexer 92. The 7 most significant bits plus a PCU15 bit (to be discussed later) which are output from the program counter 82 are coupled by serial line 88 to the (a) input of multiplexer 90. The outputs of multiplexers 90 and 92 are coupled to the D port where they are output on lines 44 and 46 to the PCU and PCL shift registers 40 and 42 on the NVM die.

The processor die also includes an 8-bit ADDRESS HIGH shift register 94 and an 8-bit ADDRESS LOW shift register 96 and multiplexers 90 and 92. In the in-system programming mode, the processor core 78 uses the program counter to address on-board ROM 118 for fetching instructions. However, processor core 78 still must provide an EPROM address which is to be programmed. Accordingly, processor core 78 outputs an EPROM address on its data-out bus 99 in two 8-bit serial packets. The (b) input terminals of multiplexers 90 and 92 as well as the input terminals of ADDRESS HIGH and ADDRESS LOW registers 94 and 96 are coupled to the data-out bus 99 to receive the address. In particular, multiplexer 92 and ADDRESS LOW register 96 are clocked to accept the 8 LSBs of the address. Multiplexer 90 and ADDRESS HIGH register 94 are clocked to accept the 7 MSBs and the PCU15 bit. As previously described with respect to the program counter addresses, the outputs of multiplexers 90 and 92 are coupled to the PCU and PCL shift registers 40 and 42 on the NVM die, respectively.

The address high and address low registers 94 and 96 are serial-to-serial shift registers and their outputs are coupled to the data input bus 98. These registers and these connections are provided to allow the user to read the addresses back to the processor. This is a useful feature for the user for purposes of verifying operation of the MCP.

Multiplexer 106 is coupled to receive data from the data-out bus at its (a) input terminal so that it can receive the 8-bit serial data which is intended for the INPUT DATA register 52 on the NVM die. As previously noted in the discussion of the NVM die, this may be program data to be programmed into the NVM core memory, NVM control bits intended for the timing and control circuitry 32 or data intended for external devices through the R port 20.

The output terminal of multiplexer 106 is coupled to DATA register 104 and also, through the D port and line 54, to the NVM die, where it is coupled to componentry as previously discussed. Data register 104 is a serial-to-serial shift register having its output coupled to the data-in bus 98. This allows the user of the MCP to read the data back to the processor 78 for operations verification, as discussed above with respect to the address registers 94 and 96.

The (b) input of multiplexer 106 is coupled to return data line 66 from the NVM die 14 through the D port 16 so that register 104 alternately can be used to hold returning instructions from the NVM core. Of course, normally the returning instructions on line 66 would be sent to the instruction register 80 of the processor core 78 and not to multiplexer 106 and data register 104. However, during in-system programming, data written out of the instruction memory is returned to the data bus 98 for verification by the processor core rather than to the instruction register 80 for execution. Thus, in ISP mode, multiplexer 106 selects its (b) input during programming verification operations to receive instructions on line 66 from the EPROM 31.

Return data line 66 from the NVM die also is coupled to the (a) input of multiplexer 116. The output of multiplexer 116 is coupled to the instruction register 80 of the processor core 78. In normal run mode, instructions which are returned to the processor die on line 66 are sent to the instruction register 80 through the (a) input of multiplexer 116.

In addition, the processor die includes an on-board ROM 118 out of which instructions are fetched when in the in-system programming mode. Accordingly, program counter lines 86 and 88 are also coupled to address ROM 118. The instructions output from ROM 118 are supplied to the instruction register 80 through the (b) input of multiplexer 116 when in the in-system programming mode.

A serial shift in/parallel out MEMORY INTERFACE CONTROL (MICTL) register 110 also is coupled to data-out bus 99. Different bits in the parallel output of MICTL register 110 are sent to the control inputs of different multiplexers to control those multiplexers responsive to the control bit conditions. Particularly, and as will be described in greater detail below, the conditions of the MICTL bits will dictate data paths through multiplexers 90, 92, 106 and 116. The MICTL bits also go out through the D port on line 57 to the corresponding MICTL register 68 on the NVM die.

A serial clock output, SCLK, and a load signal, XLD, also are provided from the processor die to the NVM die through the D port 16, as previously noted.

Detailed Disclosure of Operation:

FIGS. 4A, 4B, 4C and 4D generally illustrate the communication connections between the dice and with external devices in the various operational modes. As shown in FIG. 4A, in run mode, the processor die 12 and NVM die 14 communicate through interface 18. Interface 18 allows the processor 78 to send data to external devices, generally illustrated at 140, through path 21 and R port 20. Interface 18 provides data paths between the processor die 12 and the EPROM 31 for instruction fetching.

In the in-system programming mode, illustrated in FIG. 4B, the interface 18 is configured almost identically to its configuration in run mode. The in-system programming mode differs from run mode in that the R port 20 is frozen since there is no communication with external devices when the EPROM 31 is being programmed by the processor and data path 21 is rerouted to the EPROM 31 and used to carry the data which is to be programmed into NVM 31.

As illustrated by FIG. 4C, in external programming mode, an external programmer 142 is coupled to the R port 20 of the NVM die. The interface 18 is configured in external programming mode to couple the R port 20 to the NVM core so that the external programmer can exchange data with the EPROM 31, i.e., send in data to be stored and read out the stored data for purposes of verification, through the R port 20 and the interface 18. The processor die is isolated in this mode.

Finally, FIG. 4D generally illustrates the communication channels in emulation mode. As shown, in emulation mode, a development system 144 is coupled to the R port 20. The interface 18 is configured to transfer signals between the R port 20 and the processor die 12 without encountering circuitry in the NVM core.

The data flow in the various modes will now be described in more detail with reference to FIGS. 2 and 3.

Run Mode

In run mode, the program counter 82 sends out addresses for instruction fetches to the EPROM 31. Particularly, the program counter outputs two 8-bit serial data packets on PCL and PCU lines 86 and 88, respectively. The program counter 82 outputs the eight LSBs of the address on line 86 and the seven MSBs plus a PCU15 bit on line 88. Multiplexers 90 and 92 select the program counter upper and program counter lower data on their (a) inputs and output the two 8-bit serial data packets to D port 16 and on to the NVM die through lines 44 and 46. The PCU and PCL serial lines 44 and 46 are coupled to the (a) inputs of multiplexers 125 and 127. The outputs of the multiplexers are coupled to the inputs of PCL and PCU shift registers 40 and 42 on the NVM die. Multiplexers 125 and 127 are controlled, in run mode, to select their (a) inputs. After receipt of the data, registers 40 and 42 output the program counter address into NVM ADDRESS register 48. Register 48 then parallel outputs the 15 address bits to the EPROM 31 through 15-bit parallel lines 50.

The PCU15 bit may be used for any number of other purposes. For instance, in a preferred embodiment, the PCU15 bit is used to address the NVM CONTROL register which will be used during testing operations as discussed further below. Particularly, in at least one embodiment of the invention, while addresses 0000H–7FFFH address the 32 k bytes of NVM core memory, address 8001H will be used to designate the NVM control register. Other addresses above 7FFFH can be used to address other registers or locations as the need arises.

Responsive to a read pulse from timing and control circuit 32, the EPROM 31 outputs on parallel lines 60, to DATA out register 62, the eight bits of serial data stored at the selected address. The DATA OUT register converts the data to serial form and provides it to the (a) input of multiplexer 131. Multiplexer 131 is controlled, in run mode, to select its (a) input so that the data in DATA OUT register 62 is coupled to the output of multiplexer 131. The data is then shifted out of register 62 onto line 66 to the D port 16 of processor die 12. That data is loaded through the (a) input of multiplexer 116 into the instruction register 80 of the processor core 78. The processor core then executes the retrieved instruction. The processor core 78 increments the program counter 82 and repeats the process with respect to the next program counter address.

In run mode, processor core 78 also is outputting serial data on data-out bus 99 for controlling the external application hardware. That data is serially shifted into DATA register 104 on the processor die 12 through the (a) input of multiplexer 106, which is coupled to data-out bus 99. The output of multiplexer 106 also is coupled, through the D port on line 54, into the (a) input of multiplexer 129 on the NVM die. The output of multiplexer 129 is coupled to the input of the INPUT DATA register 52 on the NVM die 14. The data is then parallel output of INPUT DATA register 52 to the R port latches 36. Each one of the R port latches has its outputs coupled to an R port pin either directly through a buffer amplifier (e.g., R2) or through the (a) input of a multiplexer 133, 135, 137, 139, 141, 143 and 145 and a buffer amplifier 147 (e.g., R0, R1, R3–R7). In run mode multiplexers 133, 135, 137, 141, 143, and 145 are controlled to select their (a) inputs.

In run mode, multiplexers 121 and 123 are controlled to select their (a) inputs so that the registers in interface 18 receive the SCLK and XLD pulses from the processor core 78. In fact, for purposes of clarity, all multiplexers shown in FIGS. 2 and 3 select their (a) inputs in normal run mode.

In-System Programming Mode

As previously noted, some of the multiplexers on processor die 12 and NVM die 14 are controlled to select one of their input terminals responsive to a bit in the MICTL register. In the preferred embodiment of the invention described herein, the bits in the MICTL register control only those multiplexers the condition of which must be switched when changing from normal run mode to ISP mode. However, it should be understood that MICTL bits can be used in accordance with the invention to control any number, including all, of the multiplexers, as well as other circuitry. Also, these bits may be altered for changing signal paths for any number, including all, of the operational modes. In fact, the MICTL bits could be altered for performing different operations in a single mode, such as changing signal paths in a programming mode to switch between programming operations and data verification operations.

In any event, in the preferred embodiment described herein, these bits dictate how the multiplexers in the processor die are configured for the particular operational mode, i.e., ISP mode, and the operation which is being performed. MICTL register bits also dictate when the R port is to be frozen and when the PROGRAM DATA register 70 is to be active. In the preferred embodiment described hereinafter, the MICTL bits need be altered only when entering, exiting and in the ISP mode.

The processor core issues the MICTL bits on data-out bus 99 when entering ISP mode. That data is loaded directly from bus 99 into memory interface control (MICTL) register 110 on the processor die and, through D port 16 on line 57, into MICTL register 68 on the NVM die. The individual parallel output bits of MICTL register 110 are coupled directly to control inputs of one or more of multiplexers 90, 92, 106 and 116 for selecting the appropriate input terminal. MICTL register 68 parallel outputs the control bits to timing and control circuitry 32 which, in turn, issues signals to control circuitry on the NVM die for freezing the R port 20 and activating PROGRAM DATA register 70.

The individual MICTL bits, their functions, and the particular multiplexer(s) and/or other circuitry to which they are coupled is discussed more fully below in the section entitled *Additional Features: Memory Interface Control Register.*

In the in-system programming (ISP) mode, significant changes are made to signal paths on the processor die. Particularly, multiplexers 90, 92, 106 and 116 are switched responsive to changes in the MICTL bits. Since the processor core programs the NVM core in ISP mode, it obviously cannot fetch its running instructions out of the NVM core. Accordingly, multiplexer 116 is switched to select its (b) input so that it will execute instructions from on-board ROM 118 rather than the NVM core. On board ROM 118 contains an instruction set for running ISP mode. The program counter 82 therefore supplies addresses into ROM 118 through lines 86 and 88. The (a) inputs of multiplexers 90 and 92 therefore should be disabled. However, addresses still must be provided to the NVM core for selecting memory locations to be programmed. Thus, the processor core 78 outputs the NVM core memory address which is to be programmed in two 8-bit serial packets onto data-out bus 99. The first 8-bit packet, comprising the eight LSBs of the address, is serially shifted into ADDRESS LOW register 96. The second packet, comprising the seven MSBs and the PCU15 bit, is serially shifted into ADDRESS HIGH register 94. Multiplexers 90 and 92 are switched to select their (b) inputs to forward this address through the D port 16 to the NVM die on lines 44 and 46, where it will be treated the same as an address received out of the program counter 82 in run mode.

With respect to multiplexer 106, in ISP mode, it switches between accepting data at its (a) input and its (b) input depending upon the exact ISP programming operation which is being performed. In particular, programming of the EPROM 31 can be considered to comprise two basic steps, namely, (1) programming data into a selected address and (2) reading that data back to the processor core 78 so that it may verify that the correct data has been stored. Thus, during the programming of an address, the (a) input of multiplexer 106 is selected so that for accepting a third packet of data placed on processor data-out bus 99 (which is coupled to the (a) input of multiplexer 106) containing the data to be programmed into the NVM core memory. The program data is coupled from the output of multiplexer 106 through the D port on line 54 to INPUT DATA register 52 on the NVM die, where it will be programmed into the EPROM 31 as described.

During data verification, the EPROM 31 is pulsed again with the same address so that it outputs data stored at that address to DATA OUT register 62 on the NVM die. That data is then returned to the processor core through returning data line 66. For the verification operation, the (b) input of multiplexer 106 is selected so that the returning data goes to data register 104. The data is then shifted out of register 104 to the data-in bus 98 to processor core 78 so that it can verify that it is the same data that was supposed to be programmed into that address of the NVM core.

In ISP mode, the communication pathways on the NVM die described above with respect to run mode primarily remain the same, except that the memory interface control bits which were loaded into the MICTL registers 68 and 110 when ISP mode was entered (1) freeze the R port 20 and (2) cause the PROGRAM DATA register 70 to load data from INPUT DATA register 52. The R port is frozen by closing R port latches 36 so that data output on R port 20 remains latched rather than changing in response to new data from INPUT DATA register 52. Thus, the program data which is output on the data-out bus 99 by the processor core 78 is forwarded to the EPROM 31 through INPUT DATA register 52 and PROGRAM DATA register 70, rather than out of the R port 20 to the application hardware, as in run mode.

External Programming Mode

In external programming mode, an external programmer, such as external programmer 142 shown in FIG. 4C, programs the EPROM 31. The processor die is essentially idle and cut off from communication with the NVM die. Multiplexers 125, 127 and 129 in interface 18 are controlled to select their (b) inputs. In this manner, external programmer 142, rather than processor core 78, provides addresses and data to registers 40, 42 and 52 through R port pins R3, R5, and R0, respectively, as shown in FIG. 2.

Further, R0 is also used in this mode as an output port for data verification purposes. Particularly, as shown in FIG. 2, the serial shift output 67 of data out register 62 is coupled to the (b) input of multiplexer 133. Accordingly, during data verification operations in the external programming mode, multiplexer 133 is controlled to select its (b) input for outputting the contents of data out register 62 to the R0 pin of R port 30.

R port pins R1, R2, R4 and R6 also are used as input pins in external programming mode. In particular, R1 and R2 are input pins into timing and control circuitry 32 for running the timing and control of the NVM die 14. In one particular embodiment, they are used as a program pulse input R1 and a chip enable input (R2). The SCLK pulses are supplied on R4 and the XLD pulses are supplied on R6. Multiplexer 121 and 123 are controlled to select their (b) inputs so that the SCLK and XLD signals provided on pins R4 and R6 run the multiplexers on NVM die 14, rather than the SCLK and XLD signals provided on lines 120 and 122 by the processor at the (a) inputs of multiplexers 121 and 123. R7 accepts an inverted output enable signal (NOE) in external programming mode. This bit, shown coupled to timing and control circuitry 32, is used to control the directional flow on R port pin R0 in external programming mode. In particular, as noted above, in external programming mode, R0 is used for inputting data during programming and is used for outputting data (for data verification purposes) during verification operations. Accordingly, buffer amplifier 147 associated with pin R0 must be turned off during programming and on during verification. This is controlled by the NOE signal provided to pin R7.

In this manner, the R port which is used for data exchange between the processor core and external application devices in run mode is re-used in external programming mode to communicate with the external programmer 142.

Emulation Mode

In emulation mode, an external development system, such as development system 144 shown in FIG. 4D, essentially replaces the NVM die 14. In other words, the processor die fetches instructions through its D port, interface 18 and R port 20 from the development system 144 rather than the EPROM 31. The communication channels on the processor die are essentially the same as described above with respect to run mode. However, in interface 18, and R port 30 on the NVM die, various multiplexers are switched in order to allow the processor die to fetch instructions out of the development system through the R port rather than from the NVM die. In particular, as shown in FIG. 2, PCU and PCL lines 44 and 46 from the processor die are coupled to the (b) inputs of multiplexers 137 and 135 in the R port, respectively. PCU and PCL shift registers 40 and 42 are held inactive and multiplexers 137 and 135 are controlled to select their (b) inputs so that the addresses provided out of the program counter 82 are sent to the development system 144 through R port pins R3 and R1, respectively, rather than EPROM 31. Further, the input data register 52 is also held inactive. Data line 54 also is coupled to the (b) input of multiplexer 145 so that this data can be sent directly out to the development system 144 through R port pin R7. In emulation mode, multiplexer 145 is controlled to select its (b) input.

Instructions are returned by the development system to the processor core through R port pin R0 and the (b) input of multiplexer 131. R port multiplexers 139 and 143 are controlled to select their (b) inputs so that the SCLK and XLD signals on lines 120 and 122 from the processor die are output to the development system 144 through R port pins R4 and R6, respectively. R port multiplexer 141 is controlled to select its (b) input so that the MICTL bits can be supplied from the processor die to the development system through R port pin R5. Finally, R port pin R2 is also used as an input pin in emulation mode. In particular, it is coupled to timing and control circuitry 32 and sends it a signal which suppresses operation of the NVM core circuitry.

Additional Features

Feed-Throughs

Figure 5A:
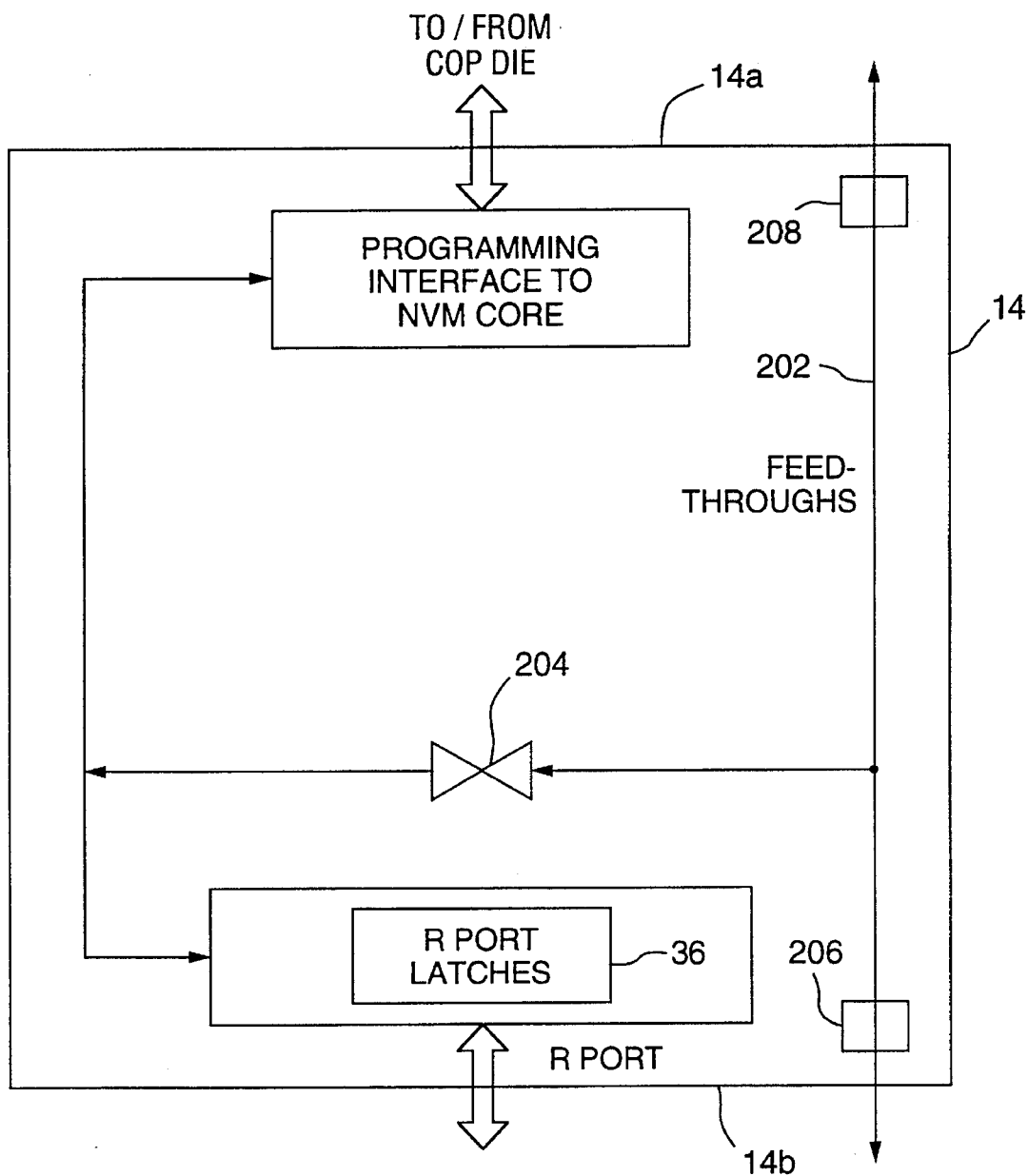
FIG. 5A is a simplified diagram of the NVM die illustrating feed-through wire traces from the package pads to the control oriented processor die and transfer gates for rerouting the data on the feed-throughs to the R port of the NVM die in accordance with the present invention.

In addition to the connections between the processor die and external devices through the interface 18 and the R port 20 on the NVM die, there are also feed-through wire traces on the NVM die providing communication paths between signals on the processor die and external devices. Unlike the connections described above with respect to the interface 18 and the R port 20, feed-throughs are simply wire traces which do not encounter any circuitry on the NVM core. Feed-throughs are typically used in situations where a first die, such as the NVM die, is in the shadow of a second die, such as the processor die, with respect to desired connections between the second die and a package pad. Feed-throughs are used because running a wire from one die over or around another die could create shorts between that wire and scribe lines or adjacent wires. Accordingly, instead of running a wire over or around another die, a short jumper wire is coupled between adjacent edges of two dice, such as edges 12a and 14a in FIG. 1, an electrical trace encountering no circuitry on the second die is patterned from the edge of the second die adjacent the first die to a pad at the opposite edge of the second die (e.g., between edge 14a and edge 14b in FIG. 1). A second short jumper wire is provided from that pad to a package pad. In FIG. 5A, such feed-throughs are pictorially represented by line 202 and the pads are represented at 206 and 208.

In a low pin count package embodying the present invention, there may not be enough external connections to the R port 20 to support all the connections needed for certain operations. For instance, an external programmer, such as external programmer 142 shown in FIG. 4C may need more connections than are available through R port 20. In such embodiments of the invention, additional pins are made available for use by the external programmer to communicate with the NVM core by providing transfer gates 204 on the feed-throughs 202. These transfer gates can be controlled responsive to the operational mode of the MCP to change the data flow path of the feed-throughs 202. In particular, in external programming mode, transfer gates 204 can be controlled to provide a path from pads 206 through transfer gates 204 to interface 18. In this manner, the pads 206 which are coupled to feed-throughs 202 in run mode can be reused for other purposes in other modes such as external programming mode and emulation mode to provide communication paths to the NVM core or the processor core.

Multiplexers instead of transfer gates may be employed. However, passive devices such as transfer gates are preferable when coupling between pads which may be unconnected and which might lead to bus contentions if an active device such as a multiplexer was used instead of a transfer gate.

Figure 5B:
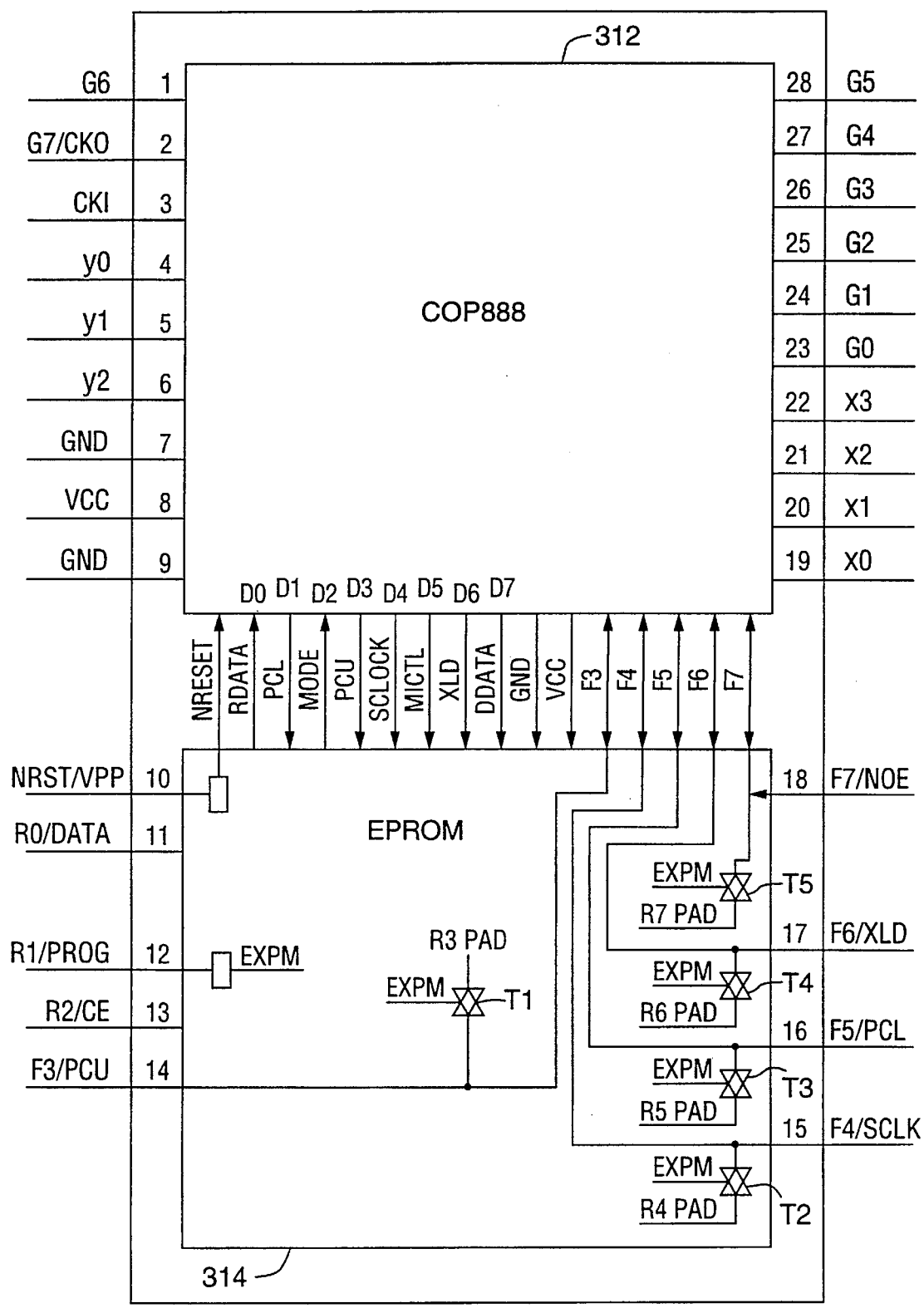
FIG. 5B is simplified diagram of a multiple chip package of the present invention illustrating the feed-throughs and transfer gates of FIG. 5A in more detail.

FIG. 5B illustrates one particular embodiment of the invention which utilizes five transfer gates. The embodiment illustrated in FIG. 5B is similar to the embodiment illustrated in FIGS. 2 and 3 except that the R port comprises only three connections, R0, R1, and R2. The NVM die 314 still includes pads R3, R4, R5, R6 and R7, but they are not coupled to the R port. Instead, they are coupled to feed-throughs F3, F4, F5, F6 and F7 through transfer gates T1, T2, T3, T4, and T5.

In this illustrated embodiment of the multiple chip processor of the present invention, feed-throughs F3 through F7 are used by the processor die 312 to communicate directly with the external application hardware. The actual use in run mode of these pins would be dictated by the application. In this embodiment of the invention, there are not enough R port pins (there are only three) to provide adequate connections for an external programmer to program the NVM die 314. Accordingly, transfer gates T1, T2, T3, T4 and T5 are provided intermediate feed-through signal paths F3, F4, F5, F6 and F7, respectively. When activated, these transfer gates allow signals placed on feed-through pads F3 through F7 to be passed through the transfer gates to pads R3 through R7 so that these pads can be used as described above with respect to the first embodiment of the invention illustrated in FIGS. 2 and 3.

Thus, as shown in the illustrated embodiment, pads F3 and F5 can be used in external programming mode for the program counter upper and program counter lower inputs from the external programmer. The transfer gates would send the signals placed on these lines by the external programmer to pads R3 and R5, respectively. Referring to FIG. 2, these signals would be routed to the program counter upper and program counter lower registers 40 and 42 as previously described with respect to the first embodiment of the invention. In addition, the SCLK and XLD signals from the external programmer are coupled to pads F4 and F6, respectively, which are connected to NVM die pads R4 and R6, respectively, through transfer gates T2 and T4, respectively. As shown in FIG. 2, the signals would be routed to the (b) inputs of multiplexers 121 and 123, respectively as previously described. Pad F7 is coupled through transfer gate T5 to R port pad R7 and is used in external programming mode to accept the NOE (not output enabled) signal for switching between programming and verification operations, as previously described.

These connections between R port pads R3 through R7 and package pads F3 through F7 can also be used as output paths to a development system in an emulation mode, such as discussed above with respect to FIG. 2. The only difference would be that rather than the R3 through R7 pads being coupled directly to the output pads through the R port, they would be connected to pads F3 through F7 through transfer gates T1 through T5. Pads R0 through R2, which remain connected to the package pads through the R port in the embodiment illustrated in FIG. 5B would operate exactly as described above with respect to the first embodiment of the invention illustrated in FIG. 2.

Reset Intercept Circuit

Figure 6:
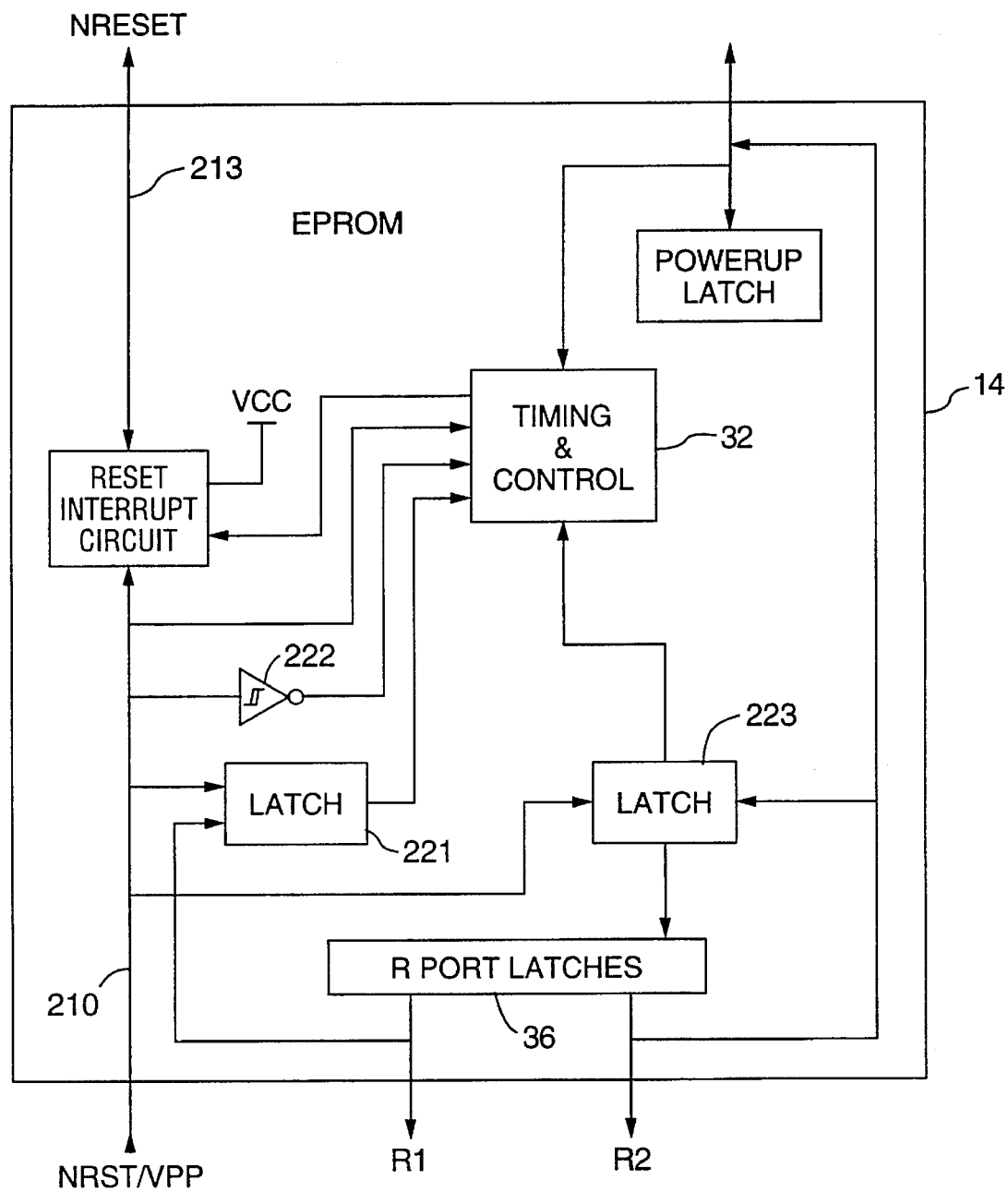
FIG. 6 is a simplified block diagram of the NVM die illustrating a reset intercept circuit of the present invention.

FIG. 6 is a block diagram illustrating another aspect of the present invention. One pad connection into the MCP is for a NRST/VPP connection. This pad is used to accept (1) a reset signal in normal run mode, (2) a high voltage power supply, $V_{pp}$, from which a program pulse can be derived in either of the programming modes, and (3) another high voltage supply, $V_{test}$, which high voltage is necessary for certain memory and processor test operations. The mode of operation of the MCP is given by the voltage on the NRST/VPP pad 210 and the voltage on R port pins R1 and R2 at the trailing edge of NRST/VPP. The condition of R1 and R2 is latched at the trailing edge of NRST/VPP.

In normal run mode, R1 and R2 are forced out as logic ones by the processor. However, these lines can be driven externally to change the mode. The timing and control circuitry 32 interprets R1, R2 and the reset signal, NRST/VPP, to determine the mode and condition of the circuitry in the MCP. In at least some embodiments of the present invention, the reset signal, NRST/VPP, provided to the processor die must be different than the reset signal provided to the circuitry on the NVM die. Table 1 below shows the desired state of the NVM die reset signal, NRST/VPP, and the processor die reset signal, NRESET. As shown in table 1, the processor die should receive the signal on NRST/VPP unless the MCP is in either of the programming modes. In these modes, the processor die should receive a logic one, $V_{cc}$, rather than the high voltage, $V_{pp}$.

TABLE 1

| MODE | input (NVM NRST/$V_{pp}$ pad) | output (to processor NRESET) |
|---|---|---|
| reset | 0 | 0 |
| run | 1 ($V_{cc}$) | 1 ($V_{cc}$) |
| external programmer | high voltage ($V_{pp}$ programming) | 1 ($V_{cc}$) |
| ISP | high voltage ($V_{pp}$ programming) | 1 ($V_{cc}$) |
| test | high voltage ($V_{test}$) | high voltage ($V_{test}$) |

The processor die receives its version of the reset signal, NRESET, through a reset intercept circuit 212 on the NVM die. In particular, the NRST/VPP signal received on line 210 from external of the MCP is input to latches 221 and 223 and a Schmidt trigger 222 for use on the NVM die. The NRST/VPP signal received on pad 210 also is sent to reset intercept circuit 212 on the NVM die which, depending on the mode of operation as dictated by mode select signals R1 and R2, creates the NRESET signal which is sent to the processor die on line 213.

TABLE 2

| MODE | NRST/VPP | NRESET | R2 | R1 | processor die | NVM die |
|---|---|---|---|---|---|---|
| Reset | 0 | 0 | out ($V_{cc}$) | out ($V_{cc}$) | reset | reset |
| Run | $V_{cc}$ | $V_{cc}$ | not gnd | not gnd | running | run |
| Test | $V_{test}$ | $V_{test}$ | not gnd | not gnd | test | test |
| Ext Prog | $V_{pp}$ | $V_{cc}$ | not gnd | gnd | static | Ext Prog |
| Emulation | $V_{cc}$ | $V_{cc}$ | gnd | x | running | Pass through |
| ISP | $V_{pp}$ | $V_{cc}$ | not gnd | not gnd | running ISP ROM | ISP |

Table 2 shows the MCP operating modes and Pad/Port activity of an exemplary MCP in accordance with the present invention. As can be seen from Table 2, the NRESET signal to the processor die is a function of the NRST/VPP signal and the operational mode.

Figure 7:
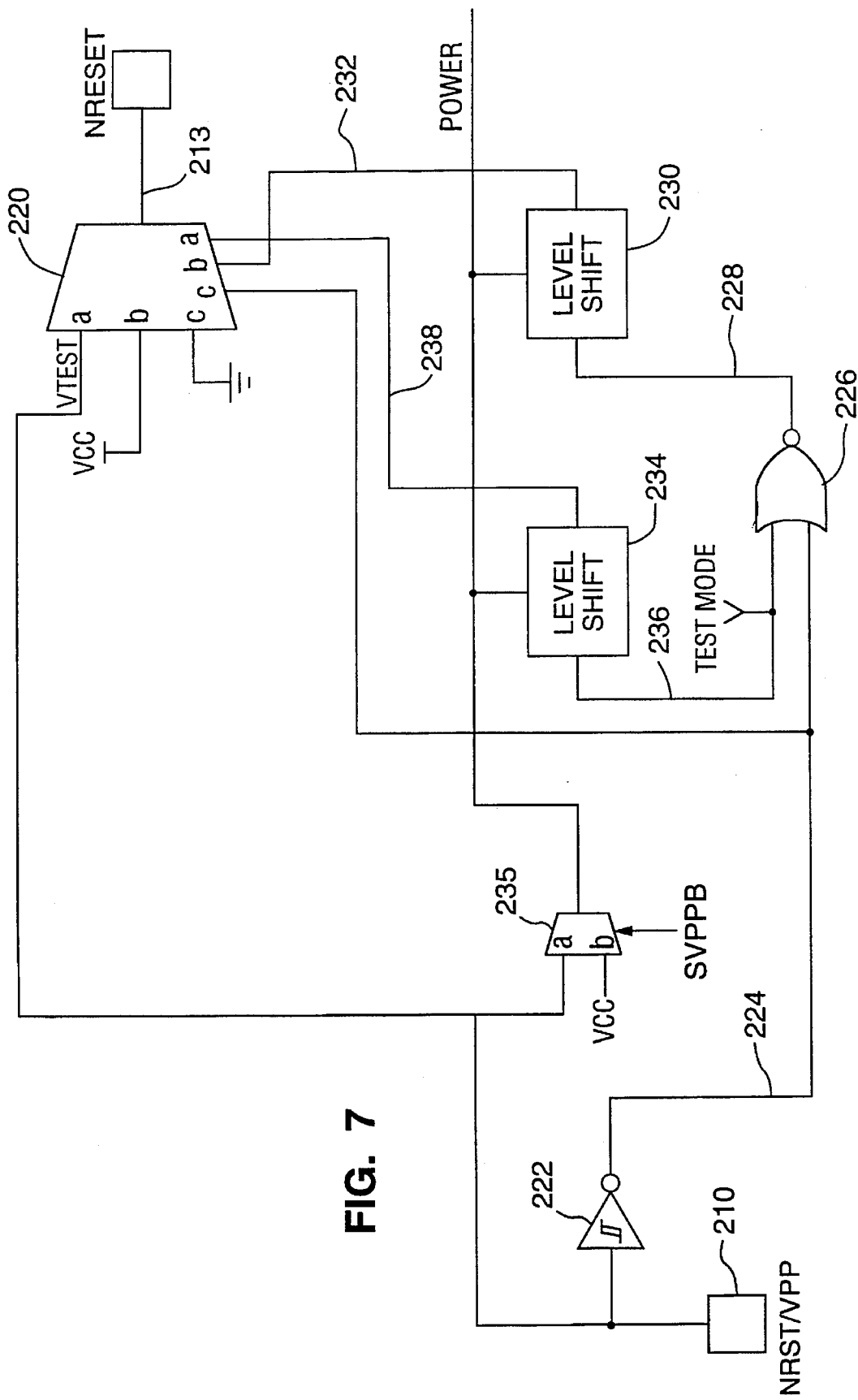
FIG. 7 is a detailed block diagram of the reset intercept circuit shown in FIG. 6.

FIG. 7 illustrates an exemplary reset intercept circuit 212 for achieving the necessary conditioning of the NRST/VPP signal to produce an appropriate NRESET signal for the processor die. As shown in Table 1, a logic zero on NRST/VPP should always result in a logic zero being provided to the processor die on the NRESET signal line 213 and a logic one ($V_{cc}$) on NRST/VPP should always result in a logic one being provided to the processor die on the NRESET signal line 213. However, if a higher voltage is provided on NRST/VPP, that high voltage is provided to the NRESET signal line 213 only if the MCP is in test mode. Otherwise, a logic one must be provided on the NRESET line 213 to processor die 12.

As shown in FIG. 7, the NRST/VPP signal on line 210 is provided directly to (1) the (a) data input of multiplexer 220, (2) the (a) data input of multiplexer 235, and (3) inverting Schmidt trigger 222. The (b) data input of multiplexer 220 is coupled to a $V_{cc}$ source and the (c) data input of multiplexer 220 is coupled to ground. The (b) data input of multiplexer 235 is coupled to $V_{cc}$. The output of the multiplexer 220 is the NRESET signal 213 which is provided to the processor die. The output of multiplexer 235 is coupled to the power input terminals of level shifters 230 and 234. Multiplexer 235 is controlled by an SVPPB signal which is logic zero when NRST/VPP is a high voltage (e.g., VTEST or VPP), but is a logic one when NRST/VPP is not a high voltage (e.g., VCC or ground). The output signals of level shifters 230 and 234 are coupled to the (b) and (a) control inputs of multiplexer 220, respectively, for purposes of selecting one of the inputs of multiplexer 220.

Level shifters 230 and 234 are tri-value level shifters. When the control input to the level shifters is logic zero, they output logic zeros regardless of the power supply value. However, when the control input to the level shifters 230 and 234 is logic one, they output a value equal to the signal on their power lines (which will either be $V_{cc}$ or the signal at NRST/VPP, as dictated by multiplexer 235).

The need for the tri-value level shifters is strictly for circuit purposes and not logic purposes. Particularly, the voltage level at the control inputs to the multiplexer must be at least equal to that of the data input in order to prevent forward biasing of pn junctions in the multiplexer, which would result in improper operation of the multiplexer. Thus, whenever the signal on NRST/VPP is a high voltage ($V_{test}$ or $V_{pp}$), multiplexer 235, under control of the SVPPB signal, provides that signal on NRST/VPP as the power supply for the level shifters to assure that the signals placed on the control inputs of multiplexer 220 are at least as high as the voltage at a data input of multiplexer 220.

If the NRST/VPP signal is a logic zero, then a logic zero must be output on the NRESET signal line or, in other words, the (c) input of multiplexer 220 must be selected and the (a) and (b) inputs must be deselected. Accordingly, in response to a logic zero at pad 210, inverting Schmidt trigger 222 provides a logic one out on line 224 to NOR gate 226. In response to the logic one on line 224, NOR gate 226 will output a logic zero on line 228 to level shifter 230. Level shifter 230 in response to the logic zero on line 228 outputs a logic zero on line 232 to the b control input of multiplexer 220, thus deselecting the (b) input. Further, as shown in FIG. 7, level shifter 234 is responsive solely to a test mode signal which will always be a logic zero unless R1 and R2 dictate that the MCP is in test mode. The logic zero is provided to level shifter 234 on line 236 causing level shifter 234 to output a logic zero on line 238, thus deselecting the a control input of multiplexer 220. The aforementioned logic one on line 224 is also provided directly to the c control input of multiplexer 220, thus selecting input (c), i.e., logic zero (ground) as the NRESET signal output from multiplexer 220 to the processor die on line 213.

When the signal on pad 210 is $V_{cc}$ or a higher voltage, the output of inverting Schmidt trigger 222 on line 224 is a logic zero, thus deselecting the c control input of multiplexer 220. If test mode is asserted (logic one), then that logic one is provided on line 236 to level shifter 234. If test mode is asserted, then it is known that the signal on NRST/VPP pad 210 is $V_{test}$ and that the control signal SVPPB of multiplexer 235 will select the (a) input of multiplexer 235, i.e., $V_{test}$. Accordingly, $V_{test}$ is provided to the power inputs of level shifters 230 and 234 through the output of multiplexer 235. Accordingly, level shifter 234 outputs a high voltage to the a control input of multiplexer 220, thus selecting the signal at the (a) input of multiplexer 220, i.e., $V_{test}$. The logic one on line 236 also causes NOR gate 226 to output a logic zero on line 228 causes level shifter 230 to output a logic zero on line 232, deselecting the b control input of multiplexer 220. Accordingly, under these conditions, the (a) input of multiplexer 220 is selected and forwarded to the NRESET line to the processor die. As shown, the pad 210 is coupled directly to the (a) input such that, in test mode, when high voltage $V_{test}$ is provided to pad 210, it is forwarded to the processor die on the NRESET signal line 213.

When test mode signal line 236 is not asserted, and the NRST/VPP signal is anything other than a zero, the (c) input of multiplexer 220 is deselected because line 224 will be a logic zero. Further, the (a) input of multiplexer 220 will be deselected because the logic zero on line 236 will cause level shifter 234 to output a logic zero to the a control input of multiplexer 220. However, the logic zero at the test mode signal on 236 and the logic zero on line 224 output from the Schmidt trigger will cause NOR gate 226 to output a logic one ($V_{cc}$) on line 228. That logic one will cause level shifter 230 to output a select signal to the b control input of multiplexer 220, which will cause multiplexer 220 to provide $V_{cc}$ at the NRESET output 213. Thus, regardless of whether the voltage on NRST/VPP is a logic one ($V_{cc}$) or high voltage $V_{pp}$, the NRESET signal will be $V_{cc}$. Thus, the circuitry shown in FIG. 7 and discussed above, will produce the truth table shown in Table 1 in which NRESET is the same as the signal on NRST/VPP except when in one of the programming modes, where NRESET is a logic one ($V_{cc}$), while NRST/VPP is a high voltage $V_{pp}$.

The Memory Interface Control Register

Turning now to the memory interface control (MICTL) register, it contains up to eight memory interface control bits for controlling the multiplexers and timing and control circuitry on the NVM and processor dice. Only five of these control bits are relevant to the present invention. Those bits are: (1) a not (i.e., asserted negative) in-system programming mode (NISPM) bit; (2) a not program (NPROG) bit; (3) a program counter to address (PCTAD) bit; (4) a D port data output selected (DPDOS) bit; and (5) a not on-board ROM select (NORS) bit. These control bits are provided to the MICTL registers 68 and 110 from the processor core 78 as previously described. These bits are then written out of these registers to timing and control circuitry and/or directly to the multiplexers on each die. Responsive to these bits, the timing and control circuitry and multiplexers set conditions to create the desired communication pathways.

In a preferred embodiment of the invention, these bits are configured such that they are all reset high, except in ISP mode. In ISP mode, these bits are all switched low at various times for ISP operation, as described further below. The memory interface control bits may be switched simultaneously or at different times relative to each other, depending on the particular circuit embodiment of the invention.

The control of the various multiplexers described above with respect to FIGS. 2 and 3 is of primary concern to the present invention and will be described in detail below. However, the MICTL bits may also be used to set additional timing and control conditions.

The NISPM bit is asserted low when the MCP is in the in-system programming mode. It is asserted high in all other circumstances. The NISPM bit is provided to timing and control circuitry 32 on NVM die 14 for controlling the R port. When the NISPM bit is low, the R port latches 36 are frozen such that the R port outputs are not affected by data shifted out of the input data register 52. In this manner, program data (or NVM control data) placed on the bus 99 on the processor die and loaded into input data register 52 can be shifted out of register 52 into the program data register 70 or the NVM control register 72 without affecting the condition of the R port. In run mode, emulation mode and external programming mode, the NISPM bit is maintained at a logic 1 which controls the R port to run normally so that data can be exchanged with external devices through input data register 52 and the R port 20.

The NPROG bit is a program pulse bit provided out of NVM die MICTL register 68 to timing and control circuitry 32. When this bit is asserted low, PROGRAM DATA register 70 is made active so that a byte addressed in the EPROM 31 by NVM address register 48 is written with data supplied to the EPROM 31 through PROGRAM DATA register 70. When the bit is unasserted at logic one, PROGRAM DATA register 70 is made inactive so that no programming takes place.

The PCTAD bit serves two primary functions. First, when this bit is 1, multiplexers 90 and 92 are controlled to select their (a) inputs so that the addresses supplied to the processor core are from the program counter 82. When the PCTAD bit is 0, multiplexers 90 and 92 are controlled to select their (b) inputs so that the addresses into the EPROM 31 come from data-out bus 99 through the address high and address low registers 94 and 96.

Also, on the NVM die, when the PCTAD bit is 1, the PCU15 bit is ignored and all accesses are restricted to the normal 32 k user array in the EPROM 31. However, when the PCTAD bit is 0, the PCU15 bit is treated as the sixteenth address bit in order to enable selection of special locations outside of the normal user array. For instance, the NVM control register is accessed for reading and writing with address 8001H. Of course, when the PCU15 bit is a 0, only addresses from the normal user array are selected, even if the PCTAD bit is asserted.

Thus, the PCTAD bit is provided out of processor die MICTL register 110 to the control input of multiplexers 90 and 92. It also is provided out of NVM die MICTL register 68 to timing and control circuitry 32 to activate extended addressing.

The DPDOS bit is coupled out of processor die MICTL register 68 to control multiplexer 106 on the processor die. In particular, when this bit is 1, multiplexer 106 is controlled so that DATA register 104 can be used to store data placed on data-out bus 99 by the processor core 78 for transmission through the D port to the NVM die. In run mode and emulation mode, the data placed on the bus 99 by processor core 78 is data which is intended for the R port. In ISP mode, this data is program data intended for the PROGRAM DATA register 70 on the NVM die 14.

The DPDOS bit is set to 0 for programming verification in ISP mode. Particularly, when the DPDOS bit is 0, multiplexer 106 on the processor die accepts data at its (b) input for shifting into DATA register 104. This allows data on line 66 from the DATA OUT register 62 on the NVM die to be stored in DATA register 104 and then written out to data-in bus 98 for programming verification purposes.

Finally, the NORS bit controls multiplexer 116. When this bit is 0, multiplexer 116 selects its (b) input so that instruction data to the processor instruction register 80 comes from the on-board ROM 118. This path is used only in the in-system programming mode. In all other circumstances, this bit is maintained at logic one to control multiplexer 116 to select data at its (a) input, whereby the instructions into the instruction register 80 are received on line 66 from the DATA OUT register 62, through multiplexer 131, on the NVM die. As previously discussed, the data in register 62 would be instructions from the EPROM 31 in normal run mode or from external devices through the R port in emulation mode.

The NVM Control Register

The processor core 78 can also place control bits in the NVM control register 72 through data-out bus 99, multiplexer 106, data register 104, line 54, the (a) input of multiplexer 129, and INPUT DATA register 52. The NVM control register can also be loaded in external programming mode by an external programmer through R port pin R0, the (b) input of multiplexer 129, and INPUT DATA register 52.

The NVM control bits and the NVM control register are used only during operations to test the integrity of the EPROM 31. There are five NVM control bits of relevance. They are: (1) a gang programming (GANG4) bit; (2) a disturb programming stress mode 2 (DPS2) bit; (3) a disturb programming stress mode 1 (DPS1) bit; (4) a one time programmable column access (OTPCA) bit; and (5) a one time programmable row access (OTPRA) bit.

The GANG4 bit enables 4 bytes to be programmed simultaneously. The DPS2 bit places the NVM core in a program disturb mode, in which columns are stressed while rows are held low. The DPS1 bit places the NVM core in a DC erase disturb mode, in which certain programmed bits which may lose their charge if defective are stressed. The OTPCA bit selects a special column for packaged array testing where the column is selected by this mode bit and the rows are selected normally by addresses. Finally, the OTPRA bit selects a special row for packaged array testing, where the row is selected by this mode bit and the columns are selected normally by addresses. The output of the NVM control register 72 is sent to timing and control circuitry 32 which sets the above-noted conditions in the EPROM 31.

By using the processor core to load control registers such as the NVM control register 72 and the memory interface register 68, primary control of operation of the MCP is under software control. This reduces the amount of hardware needed in the MCP for control functions. Of course, in alternate embodiments, the control registers may be hardware controlled.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. A multiple chip package processor having multiple operational modes, including a run mode and an in-system programming mode, said multiple chip package processor comprising;

a processor die, including a central processing unit having a data output terminal for outputting data and a program counter terminal for outputting addresses for instruction fetching from a program counter in said central processing unit, a memory die, including a primary memory for storing instructions for operating said central processing unit in said run mode, said primary memory having a plurality of addressable storage locations, an address input terminal for accepting addresses for accessing said storage locations, a data input terminal for accepting data to be stored in said storage locations, and a data output terminal for outputting data stored in said storage locations, a package enclosing said processor die and said memory die, a second memory on said processor die for storing an instruction set for programming said primary memory in said in-system programming mode, a first multiplexer having a first input coupled to said program counter terminal and a second input coupled to said data output terminal of said central processing unit and an output terminal coupled to said primary memory, and a control circuit for controlling said first multiplexer to select its first input in said run mode so that said primary memory is addressed by said program counter and to select its second input in said in-system programming mode so that said primary memory is addressed by data at said data output terminal of said central processing unit.

2. A multiple chip package processor as set forth in claim 1 wherein said multiple chip package processor further comprises;

an instruction register in said central processing unit, and a second multiplexer having a first input terminal coupled to said data output terminal of said primary memory and a second input terminal coupled to receive instructions output from said second memory, said second multiplexer having an output terminal coupled to said instruction register and further wherein said control circuit controls said second multiplexer to select its first input in said run mode and to select its second input in said in-system programming mode.

3. A multiple chip package processor as set forth in claim 2 wherein, in said run mode, said central processing unit outputs data at said data output terminal for controlling circuitry external to said multiple chip package processor and, in said in-system programming mode, outputs at said data output terminal addresses in said primary memory which are to be programmed and data which is to be programmed into an addressed storage location in said primary memory.

4. A multiple chip package processor as set forth in claim 3 further comprising;

a data input terminal for said central processing unit, a data register on said processor die for temporarily storing data, said data register having an input terminal and an output terminal, said output terminal coupled to said input terminal of said central processing unit, and a third multiplexer having a first input terminal coupled to said data output terminal of said central processing unit and a second input terminal coupled to said data output terminal of said primary memory and having an output terminal coupled to said input terminal of said data register, to said external circuitry, and to said data input terminal of said memory, and wherein, in run mode, said control circuit controls said third multiplexer to select its first input so that data supplied at said data output terminal of said central processing unit is supplied to said external circuitry.

5. A multiple chip package processor as set forth in claim 4 wherein, in said in-system programming mode, a program operation and a verification operation are performed sequentially, and wherein said control means controls said third multiplexer, in said in-system programming mode, to select its first input during a program operation so that said data supplied at said data output terminal of said central processing unit is provided to said data input terminal of said memory, and to select its second input during a verification operation so that data at said data output terminal of said memory is supplied through said data register to said data input terminal of said central processing unit.

6. A multiple chip package processor as set forth in claim 5 wherein said output terminal of said third multiplexer is coupled to said data input terminal of said primary memory through a program data register and to said external circuitry through an output port and wherein said control means further controls said program data register and said output port to freeze said output port and activate said program data register in said in-system programming mode and to freeze said program data register and activate said output port in said run mode.

7. A multiple chip package processor as set forth in claim 6 wherein said control means includes a memory interface control register and said first, second and third multiplexers are controlled responsive to one or more bits in said memory interface control register.

8. A multiple chip package processor as set forth in claim 7 wherein said multiplexers further have control inputs which select the first or second input of the multiplexers, and wherein one or more bits in said memory interface control register are coupled directly to the control inputs of said multiplexers.

9. A multiple chip package processor as set forth in claim 8 wherein said program counter terminal comprises two program counter terminals and said first multiplexer comprises two multiplexers.

10. A multiple chip package processor as set forth in claim 4 wherein said data register is a serial shift register.

* * * * *